United States Patent [19]

Culver

[11] 4,281,253
[45] Jul. 28, 1981

[54] APPLICATIONS OF DUAL FUNCTION ELECTRO-OPTIC TRANSDUCER IN OPTICAL SIGNAL TRANSMISSION

[75] Inventor: William H. Culver, Gaithersburg, Md.

[73] Assignee: Optelecom, Inc., Gaithersburg, Md.

[21] Appl. No.: 937,828

[22] Filed: Aug. 29, 1978

[51] Int. Cl.³ .................. H01L 31/12; H01L 33/00
[52] U.S. Cl. ..................... 250/551; 250/211 J; 350/96.16; 357/17; 357/19
[58] Field of Search ............ 250/551, 211 J; 357/19, 357/17; 350/96.16, 96.18, 96.20; 331/94.5 H

[56] References Cited

U.S. PATENT DOCUMENTS

| | | | |
|---|---|---|---|
| 3,413,480 | 11/1968 | Biard et al. | 250/551 |
| 3,518,574 | 6/1970 | Rutz | 331/94.5 H |
| 3,877,052 | 4/1975 | Dixon et al. | 357/16 X |
| 3,881,113 | 4/1975 | Rideout et al. | 357/19 |
| 3,936,855 | 2/1976 | Goell et al. | 357/17 |
| 3,952,265 | 4/1976 | Hunsperger | 357/19 X |
| 3,968,564 | 7/1976 | Springthorpe | 357/17 X |
| 3,979,587 | 9/1976 | de Cremoux | 250/211 J |
| 4,010,483 | 3/1977 | Liu | 357/17 |
| 4,152,713 | 5/1979 | Copeland et al. | 357/19 |
| 4,176,367 | 11/1979 | Uematsu | 357/17 X |

FOREIGN PATENT DOCUMENTS 2816312 10/1978 Fed. Rep. of Germany ............ 357/19

OTHER PUBLICATIONS

R. Hoss & Dr. F. Weigl; "A Fiber Optically Linked 100 Channel Voice Intercom"; Collins Radio Group, Rockwell International Corp., Dallas, Texas; Feb. 1975; pp. ThA5-1 to ThA5-4.

Primary Examiner—David C. Nelms
Assistant Examiner—Edward P. Westin
Attorney, Agent, or Firm—Kerkam, Stowell, Kondracki & Clarke

[57] ABSTRACT

A bidirectional optical fiber cable assembly that has electrical connectors on each end and a data bus employing same are disclosed, thereby facilitating the implementation of optical fiber communication links. The bidirectional optical fiber cable assembly uses a dual function diode which functions both as a light emitter and as a detector of optical signals. This diode, which is contained within an electrical connector at the end of the cable assembly, is connected by wires to the electrical terminals of the connector and is positioned against the end of an optical fiber, which transmits the signal along the fiber cable. The use of such a cable assembly in a data bus allows the design of a data bus in which the function of signal transmission is conducted by optical signals, a function for which they are best suited by virtue of resistance to electrical interference, and in which connection and distribution of signals is done electrically, a function for which electronics is better suited than is optics. A bidirectional optical communication system that communicates directly along a path in the air is also facilitated by the use of a dual function diode.

12 Claims, 10 Drawing Figures

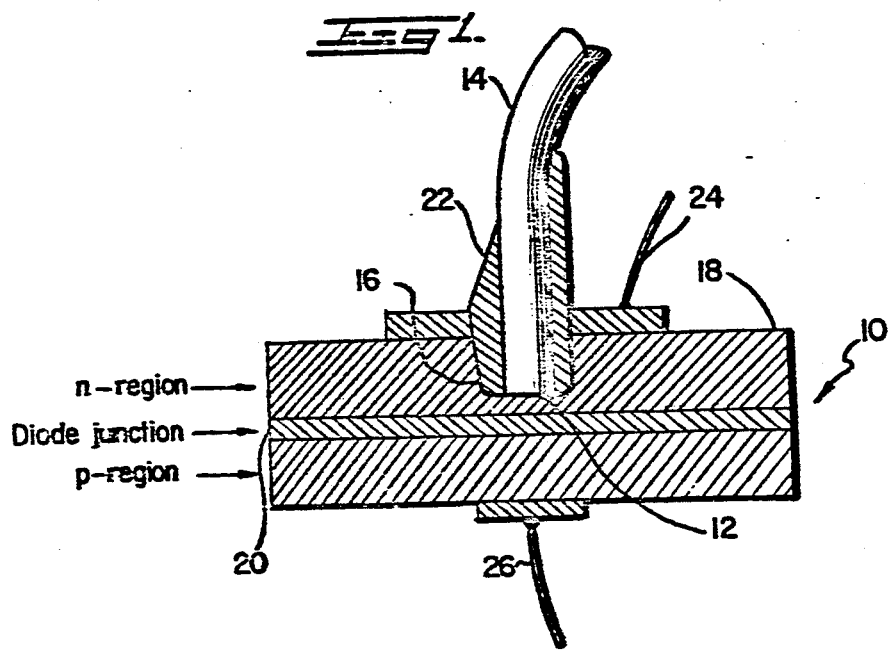
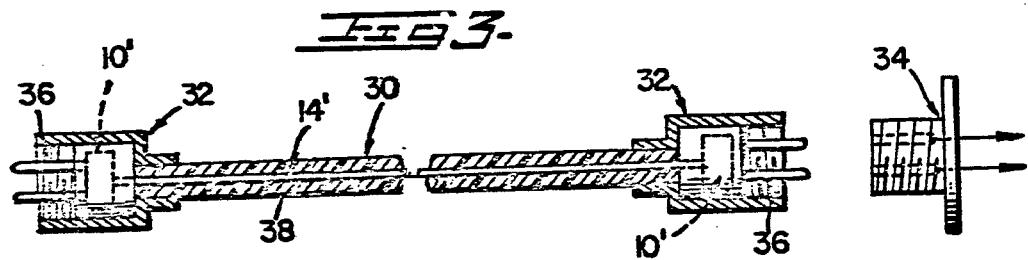

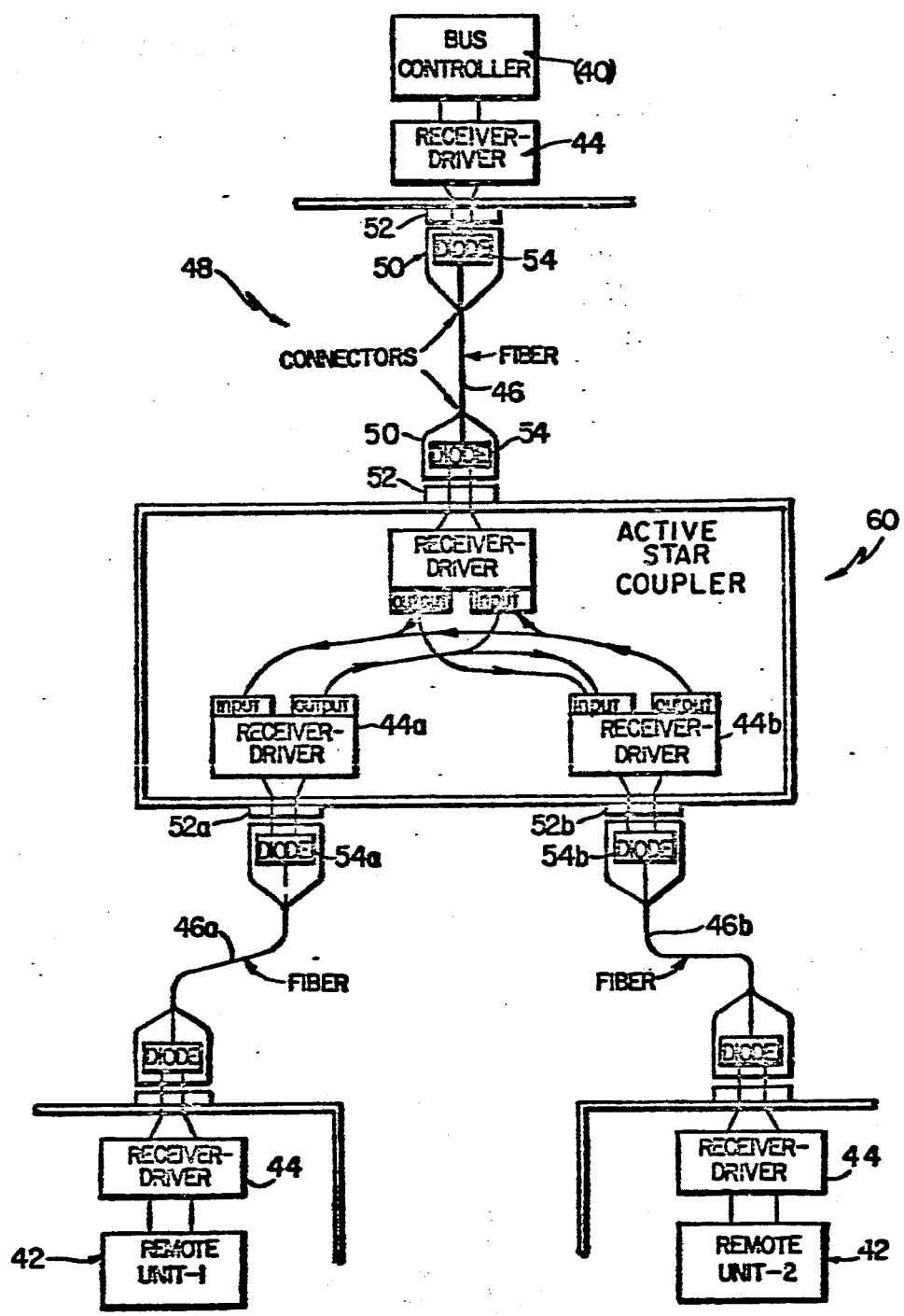

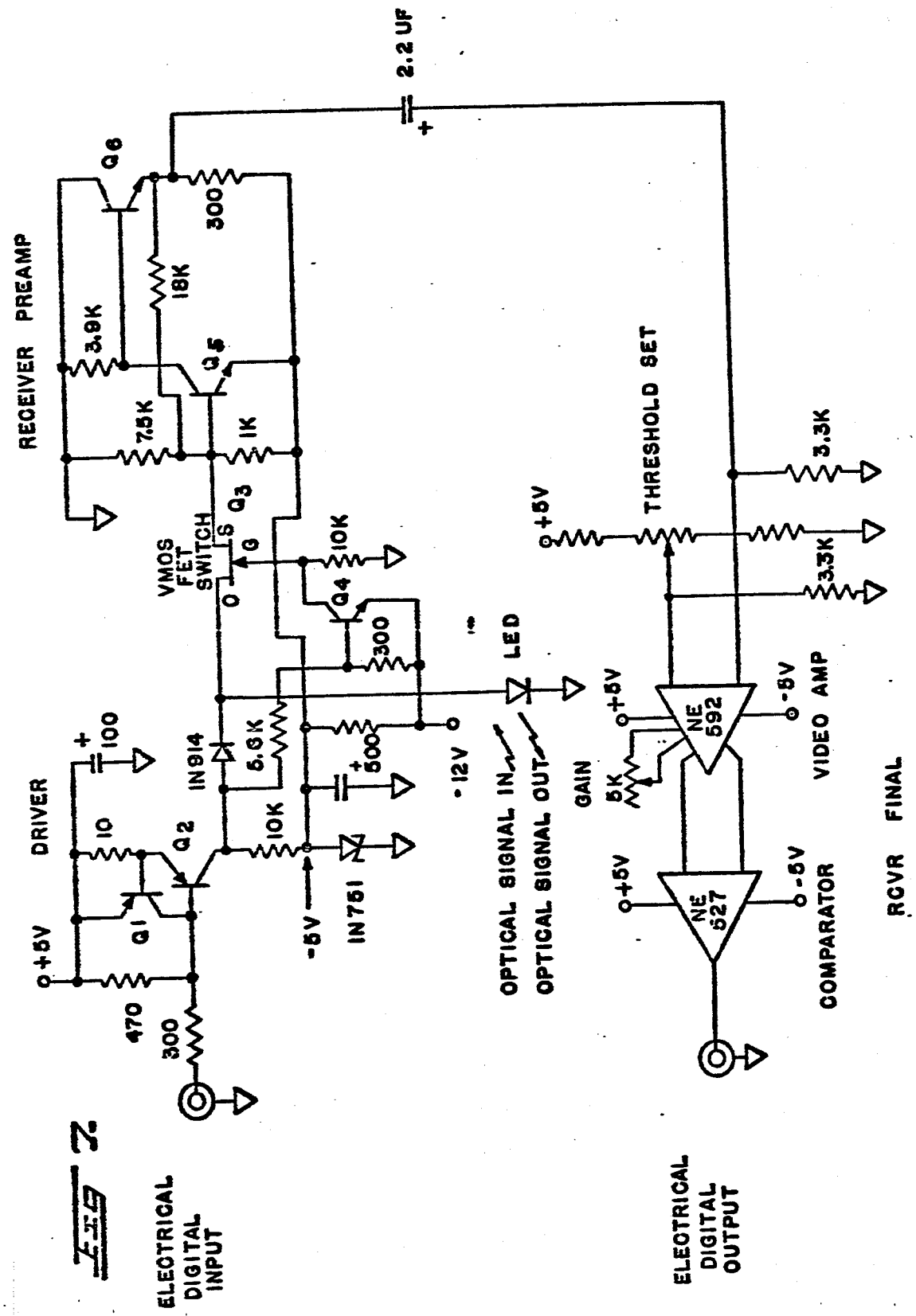

4,281,253

APPLICATIONS OF DUAL FUNCTION ELECTRO-OPTIC TRANSDUCER IN OPTICAL SIGNAL TRANSMISSION

BACKGROUND OF THE INVENTION

1. Field of the Invention

This invention is directed to two-way optical-electrical communication systems.

2. Description of the Prior Art Optical Communication Systems

Conventionally, two-way communication via an optical communication system has been accomplished either with two parallel links propagating signals in opposite directions, or with a single link employing a transmitter and a separate detector at each end and a means for separating the received signals from the transmitted signals at each end. The latter means may comprise, for example, a beam splitter mirror which partially transmits and partially reflects light off to the side.

Optical detectors for such prior art optical communication systems include such solid state semiconductor devices as p-n-p photo transistors, p-i-n photodetectors, avalanche photo diodes, Schottky-barrier devices and silicon p-n junction photo cells.

SUMMARY OF THE INVENTION

Considerable simplification and reduction in cost could be effected by utilizing a device at each end which could serve both as a transmitter and as a detector, as such an optical communication system can alternately transmit modulated signals in both directions.

The similarity of configuration of an LED to the p-n junction photo cell suggested the possibility that an LED might also be able to function effectively as a detector of radiation of the same wavelength as LED emits, if the applied voltage were reversed. The question to be answered was whether any of the possible LED configurations could function as such a detector with a high enough efficiency to be useful and advantageous in a bidirectional communication system.

It has now been discovered that bidirectional optical communication links are possible in which a single component device serves dual functions both as a transmitter which converts electrical signals to optical signals at one terminal of the bidirectional optical link and serves as a detector to convert optical to electrical signals at the same terminal of the link. This was accomplished by using a transmitting light source an LED (light emitting diode) that also operates as a detector of its own light radiation when operated with a reversed voltage bias. Thus the system operates in only one direction at a time with the device at the end of the system that is transmitting acting as an LED light source and the device at the end of the system that is receiving the signal acting as a radiation detector.

The results of the present invention has a number of other advantages. For example, in the case of beam propagation through the open air, when the system is properly aligned for propagation in one direction, it is automatically aligned for propagation in the opposite direction. In the above case or in the case of light propagation through a single quartz optical fiber, the 75% loss of light at the beam splitters is avoided.

BRIEF DESCRIPTION OF THE DRAWINGS

FIG. 1 is a diagrammatic vertical sectional view of a bidirectional diode and optical fiber arrangement of the invention;

FIG. 3 illustrates an optical fiber cable assembly for a bidirectional communication link;

FIG. 6 is a schematic diagram of data bus using optical fiber cables for transmission and electronic distributor;

FIG. 7 is a diagram showing a driver/receiver terminal for use with the present invention.

DESCRIPTION OF THE PREFERRED EMBODIMENTS

Figure 2:
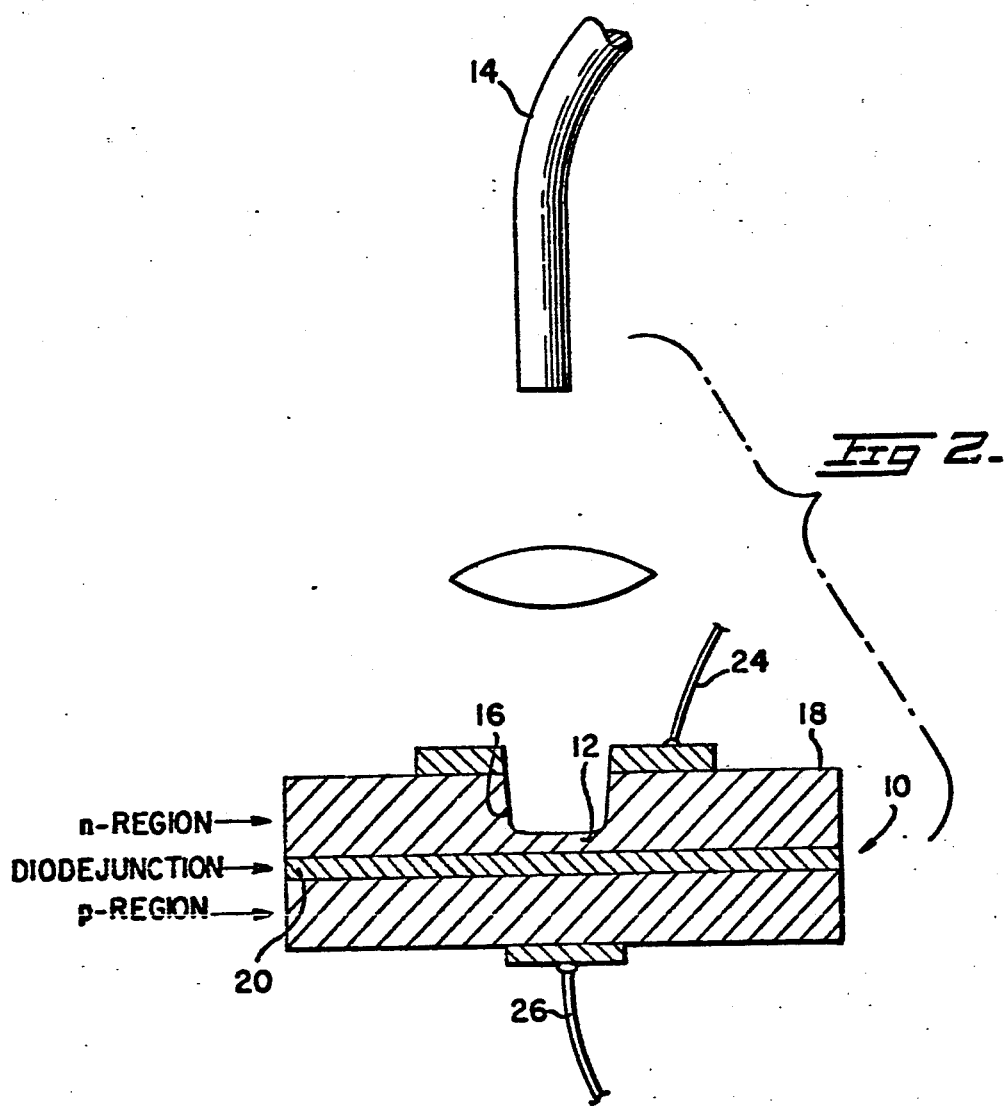
FIG. 2 is another diagrammatic vertical sectional view of a bidirectional diode and optical fiber arrangement of the invention.

It has been found that when forward voltage biased, a semiconductor LED emits photons of energy approximately equal to the energy bandgap between the energy levels of the conduction electrons and those of the valence electrons. The applied voltage injects charge carriers into the junction between n (negative) and p (positive) doped regions, wherein the electrons undergo radiative transitions to vacant valence energy levels with emission of photons with a narrow range of energy, $\sim E(gap) \sim h\nu = hc/\lambda$, where $h$ = Planck's constant
$\nu$ = light frequency
$\lambda$ = light wavelength
$c$ = light velocity The reverse process can occur wherein light photons of energy equal or greater than the energy bandgap are absorbed while exciting electrons up to the conduction band. These can be swept out of the junction region as an electric current by an electric field created by a reversed bias voltage.

The optical absorption coefficient for a semiconductor depends in a complex way on several factors. Typically, the absorption coefficient in GaAs is of the order of $10 \, cm^{-1}$ on the long wavelength side of the bandgap and about $10^4 \, cm^{-1}$ on the short wavelength side. The absorption depends upon impurity doping concentration.

In particular the optical absorption coefficient of n-type GaAs is much less than in p-type GaAs. This is due to the low density of low lying energy states of the conduction band. Only a small concentration of electrons, which is found in the n-region, can fill up to a measurable level. Since optical absorption can take place only to empty states, the absorption edge of the n-type material is at a higher energy than for p-type material. This phenomenon is called the Moss-Burnstein effect.

Because the absorption coefficient is much lower on the n side of the diode when it is used as an LED, light is most efficiently emitted from the n side. When the diode is used as a detector light of the same wavelength as emitted by the diode incident on the n side can penetrate through to the p side where it is absorbed creating a photo current.

Now, referring to FIG. 1, if a diode is used as a bidirectional element in conjunction with an optical fiber waveguide, it is the preferred configuration to have the fiber end incident from the n-material side of the diode. FIG. 1 shows the use of a "Burrus diode" configuration 10 in which the fiber end 12 of an optical fiber 14 penetrates into a well 16 etched into the n-region 18 of the diode 10 nearly to the diode junction 20, which is the source of radiated light.

The "Burrus diode" is described in the article—Burrus, C. A. and B. I. Miller "Small Area Double Heterostructure Aluminum-Gallium Arsenide Electroluminescent Diode Sources For Optical-Fiber Transmission Lines" Optical Communications Vol. 4, pp 307-309 (Dec., 1971).

In the illustrated form of the invention, the fiber 14 is affixed with a suitable seal 22 in the etched well 16. The diode is provided with a pair of electrodes 24, 25 which are connected to control electronics, which will be more fully discussed hereinafter. If the fiber has a glass cladding, epoxy resin is a suitable sealant material. If the fiber has a soft plastic cladding this cladding must be removed near the end and reclad with a hard plastic having a refractive index lower than that of the fiber.

Alternatively the surface of the diode can be focused on to the end of the fiber as in FIG. 2.

The well 16 is etched in the n-region 18 to make it thin and therefore weakly absorbing of the emitted radiation and also the received radiation. At the same time, the electrode 26 of limited area is connected to the p-region under the well. This configuration is well suited for coupling to a quartz fiber transmission medium 14. The diameter of the well 16 should be made quite small and congruant to the fiber end 12—e.g., 0.010" diameter. While the diode capacity is reduced by making it small, still special circuitry may be needed, not only to switch the bias voltage, but also to counter the diode capacity if as much as a video bandwidth is to be transmitted.

These configurations in which the optical fiber waveguide axis is essentially perpendicular to the diode junction is to be contrasted with the configuration described by Hunsperger in U.S. Pat. No. 3,952,265 in which the fiber waveguide is incident upon the diode with the waveguide axis essentially parallel to the plane of the junction.

The light output into a fiber from typical LEDs is of the order of $10^{-5}$ to $10^{-4}$ watts and the noise equivalent power of typical conventional photodiodes is of the order of $\eta^{-} \, 10^{-12}$ W-Hz$^{-1}$, where $\eta$ is the quantum efficiency.

One type of LED, BNR 40-3-30-2 High Radiance Infrared LED, made by Bell Northern Research, Ltd., was discovered with a quantum efficiency of $\eta = 0.1$ to its own radiation. It was also possible to obtain $2 \times 10^{-4}$ watts into a fiber from this diode. Thus for a communication link having 20 MHz bandwidth and a 2 km length of optical fiber giving 20 db loss an optical power signal to noise ratio of 16.5 db corresponding to an electronic power signal to noise ratio of 33 db can be obtained.

OPTICAL FIBER CABLE ASSEMBLIES USING BIDIRECTIONAL DUAL FUNCTION TRANSDUCERS

Optical fiber cable assemblies 30, FIG. 3, for a bidirectional communication link have been made in which an electrical BNC type connector half terminates each end of the optical fiber cable assembly 30. These connector halves 32 can be connected to mating bulkhead electrical connectors 34 or to electrical cables having mating connectors.

Inside each connector half 32 which terminated the cable assembly is a diode 10 that functions as a dual function transducer as hereinbefore described. Each diode 10 has two electrical lead wires generally designated 35 that are connected respectively to the two electrical conductors of the electrical connector 34.

Each end of a single optical fiber 14, contained in a ruggedized optical fiber cable 38, is brought into contact with the diodes in the manner described in reference to FIG. 1 and the ruggedized fiber cable is bonded to the connector half.

Figure 4:
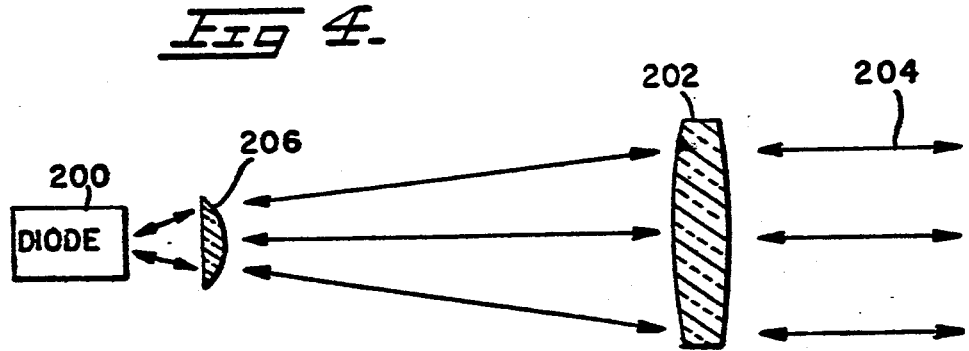
FIG. 4 shows elements of a terminal of a bidirectional optical communication system.

FIG. 4 shows elements of a terminal of bidirectional optical communication system in which a diode 200 functions as a dual function transducer as hereinfore described. When used as a transmitter the light emitted from the diode 200 is collimated by the lenses 206 and 202 and transmitted as an essentially collimated beam 204 to the receiving terminal. When used as a receiver the received light 204 is focused by the lenses 202 and 206 on to the diode 200 which functions as detector. Such a bidirectional communication system, when used for propagation through the open air has the property that when it is properly aligned for propagation in one direction it is automatically aligned for propagation in the other direction.

OPTICAL FIBER DATA BUSSES

The use of data busses has become a standard technique for transmitting signals among individual separated subsystems of large electronic systems. Descriptions of functional operational characteristics of two commonly used types of data bus are specified in Military Standard 1553A, "Aircraft Internal Time Division Command/Response Multiplex Data Bus" and U.S. Department of Defense, Apr. 30, 1975, and IEEE Standard 488-1975, "IEEE Standard Digital Interface for Programmable Instrumentation."

At the present time, data busses are customarily implemented with electrical wires as transmission lines. Demonstration data busses have been made using optical fiber wave guides as transmission lines for connecting separated electronic units. Such demonstration units are disclosed in articles by J. E. Shaunfield, and J. R. Baird, "A MIL-STD-1553 Fiber Optic Data Bus" Contract F33615-74-C-1001, Air Force Avionics Laboratory, Wright-Patterson Air Force Base, Ohio 45433, and S. R. Cole, T. A. Eppes, P. N. Steensma, "Proceedings of the Multiplex Data Bus Conference" Dayton, Ohio, Nov. 1976—NTIS AD/A-0330793 or U.S. Air Force ASD TR-76-22, p 455.

Some commonly used techniques for implementing fiber optic data busses are given below.

Figure 5A:
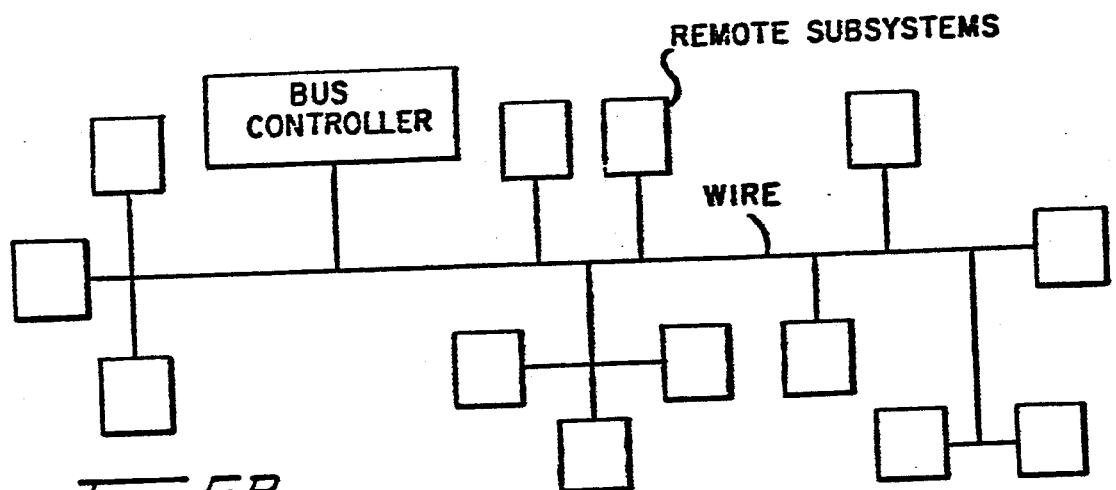
FIGS. 5A; 5B; and 5C are alternative typical network topologies, for a data bus.
Figure 5B:
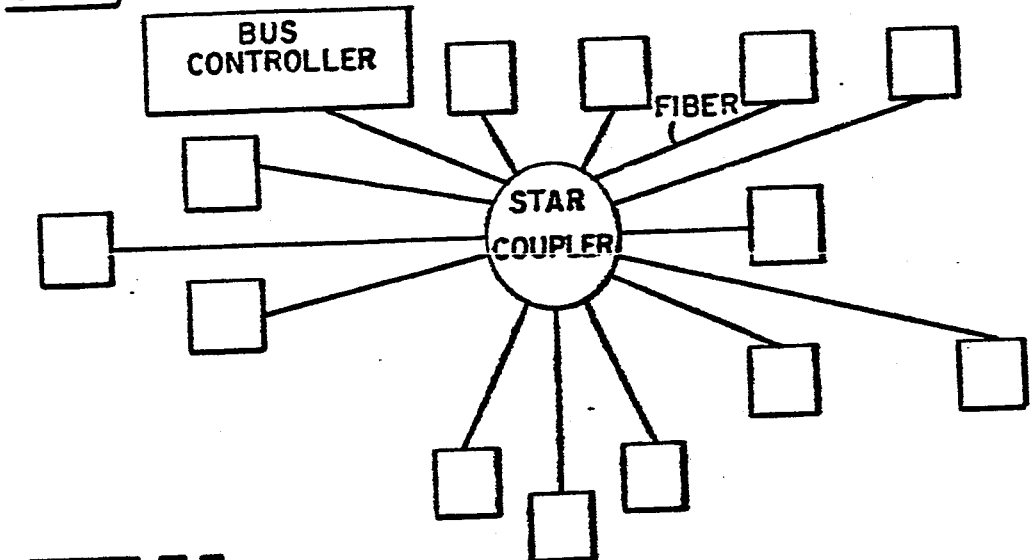

1. The network topology is such that there are very few network nodes, or branch points, between any two subsystem terminals as in FIG. 5B. In an electrical data bus a transmission line can usually branch in any way that is convenient for routing of the wires as in FIG. 5A. However, in present optical data busses there is considerable loss of signal strength at any point where a signal branches or even when it is detected or injected onto a transmission line, making it desireable or necessary to reduce the number of branching points or nodes.

A passive "Star Coupler" in which a large number of optical fibers mutually interchange signals at a single node is commonly used. If all terminals in the system are connected directly to this coupler there is only one node in the network between any two terminals. Such a system has considerable advantage in preserving standard signal strengths over any communication path. For convenience hybrid systems are sometimes used in which all terminals are not connected to a single star coupler. With the present state of the art of optical star couplers, optical transmission losses for different paths through the same optical star coupler will vary considerably giving rise to variation in signal strength at any receiver depending upon the signal source.

2. The transmitting element at each terminal is normally a separate element from the receiving element. This requires that two separate fibers be connected to the terminal or that some type of bidirectional coupler be used within the terminal to allow a single fiber to be used for both outgoing and incoming signals.

3. The transmitting and receiving elements are contained within the transmitting terminal requiring that optical signal be transmitted through an optically transmitting connecting device that connects the optical fiber transmission cable to the terminal. Similarly the optical fiber cables are attached to the star coupler or other system node element by an optically transmitting connector. Optically transmitting connectors of the present state of the art contribute signal strength loss which may vary each time they are disconnected and reconnected.

Described hereinafter is a data bus in which (1) connection between optical fiber cables and all system elements including terminals and couplers is performed with electrical connectors, (2) light emitting elements are diodes that are also used as optical detectors, thus only one fiber leading to each terminal needs to be used without the need for a bidirectional coupler, and (3) Star couplers are active electronic units which employ electronic amplification and switching.

Figure 5C:
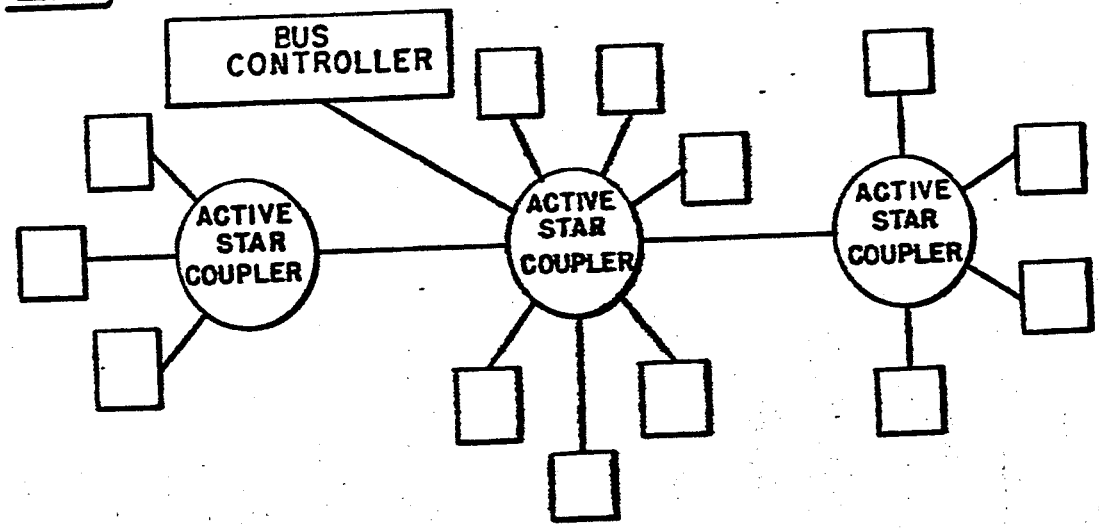

The advantages of this invention are that electronic connectors are relatively more reliable, less expensive, and eliminates the signal loss of the optical connectors. The use of a single diode for both generating and detecting optical signals reduces the cost of the optical cable assemblies by reducing either the number of fibers by a factor of two or eliminating beam splitting bidirectional couplers at the ends of each link. The active star coupler allows amplification and equilization of signal strengths, which cannot be attained with a passive coupler. Remote units connected up by a data bus employing active star couplers may be connected without regard to the number of nodes in a path between any two units, as in FIG. 5C, because the signal strength can be equalized at each node. The active coupler also allows for the use of control of this switching or signal distribution function by a processor.

Referring now to FIG. 6, a schematic design of an optical fiber data bus having the features described above is shown. In FIG. 6 the data bus controller 40 can operate as required for MIL-STD 1553A, which describes the function of a bus controller as a unit that is either programmable or controlled by a processor, and that serves the function of commanding scanning, and monitoring bus traffic. Remote units 42 are the portions of the electronic system connected together by the data bus.

The data bus requires receiver/driver units 44 which are electronic circuits as described in reference to FIG. 7. They interface the diode with the bus controller, remote unit or with other receiver/driver units. They are normally operating in a mode such that an optical signal above some minimum amplitude received by the diode will be converted to an electrical signal at the output of the receiver/driver unit. Similarly, an electrical signal above some minimum amplitude received at the input of the receiver/driver unit 44 is converted to an electrical signal required to drive the diode and cause it to emit an optical signal into the optical fiber 46 to which it is attached.

Optical fiber assemblies 48 consist of electrical connector halves 50 which connect to bulkhead mounted electrical connector halves 52 which are attached to terminals and other active system components. Electrical connector halves 50 contain diodes 54 such as diodes 10, FIG. 1, which are used as both light emitters and detectors of optical radiation which is transmitted on fibers 46.

The distributor 60 serves the function of a star coupler. In operation, the distributor is sensitive to receive an electrical signal above a minimum value from any one bulkhead connector 52 and cause a drive signal to be sent to all other bulkhead connectors 52a, 52b, etc. such that the electrical signal will cause a diode 54a, 54b, etc. to emit an optical signal into the optical fiber 46a, 46b, etc. to which it is attached.

Thus an electrical signal originated from the bus controller or any remote unit will cause a driver to drive a diode to emit light, which light will be transmitted over an optical fiber to a diode which will detect the light and cause an electrical signal which is amplified by a receiver/driver 44a, 44b, etc. in the distributor and transmitted to all other receiver/drivers in the distributor, which drive diodes 54, 54a, 54b, etc. which transmit light into optical fibers. This light is detected by diodes at the other end of the fibers where it is converted to an electrical signal which is amplified by a receiver/driver in it and transmitted to a remote unit 42.

A typical driver/receiver circuit is shown schematically in FIG. 7. When no signals are present the circuit is normally in the mode to receive either electrical or optical signals. In this mode, the LED emitter/detector is reverse biased and connected through a low impedence F.E.T. switch to the input of the receiver preamp. Transistor $Q_2$ is biased off allowing its collector to be pulled to −5 v via the 10 K resistor. This −5 v signal therefore keeps transistor $Q_4$ turned off, forward biasing the gate-source junction of the FET switch which connects the LED to the input of the receiver preamp ($Q_5$). With the LED connected to the base of $Q_5$ (approx.-4.5 V) it is reverse biased and acts as a detector. Transistors $Q_5$ and $Q_6$ serve as a transimpedence amplifier to drive the video amp, an NE592. The threshold adjustment is set so that with no received signal, the comparator, an NE527, is just biased off ($\overline{Q}$ output high). When light is received, the comparator threshold is exceeded and the electrical digital output goes low (active).

When an electrical digital drive signal is present, $Q_2$ is turned on, pulling its collector positive to a voltage such as to forward bias the LED with a drive current determined by $Q_1$ and the 10 ohm resistor. Concurrently, $Q_4$ is also turned on, reverse biasing the gate-source junction of the FET switch and causing its resistance to rise to a few megohms, effectively disconnecting the LED from the receiver preamp and preventing a digital drive signal from reaching the digital output.

Figure 8:
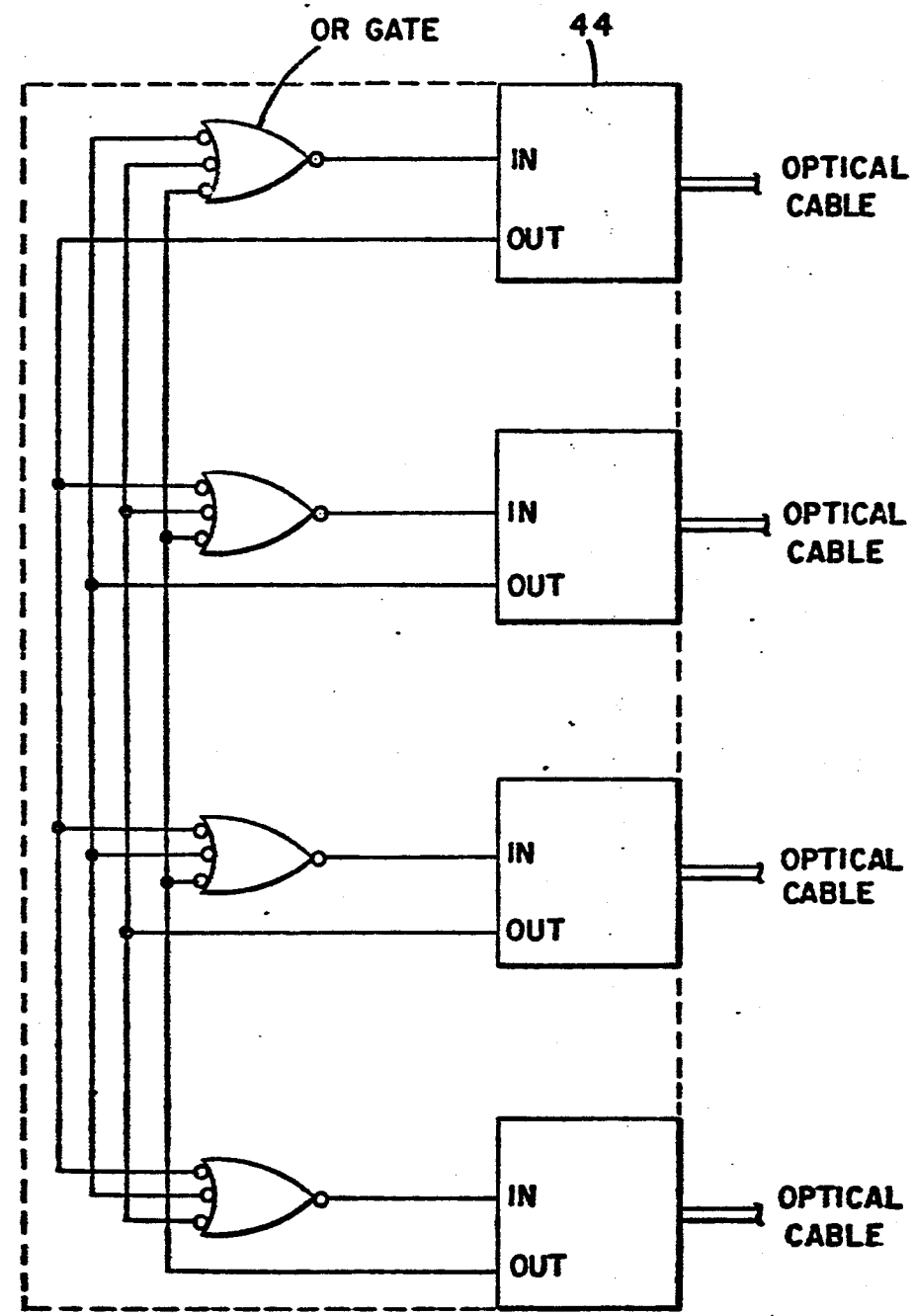
FIG. 8 is a schematic showing a typical data bus employing the driver/receiver terminals of FIG. 7.

Any number of these circuits can be connected together as shown in the 4 port example (FIG. 8). It works like this: when an optical signal is received at one of the ports, its electrical digital output goes low, driving the OR gates and consequently the digital electrical inputs of all the other circuits. This causes light to be emitted from the other three ports, the protocol of operation simply limits the number of ports which may receive light at any one time to one.

I claim:

1. An invention including at least one optical fiber cable assembly for the transmission of signals in either direction from one end of the cable assembly to the other, said cable assembly being terminated at each of the two ends with an electrical connector, and each of said connectors containing at least one semiconductor diode which functions as a dual function transducer, said diode adapted to convert the signals both from optical to electrical form and from electrical to optical form, and said cable assembly having one or more optical fibers to transmit the signals in optical form between the transducer diodes, and the ends of said fiber being positioned approximately against the diodes so that the fiber axis is essentially perpendicular to the diode junction plane, the cable assembly further characterized in that the at least one semiconductor diode is provided with a well in the n-region to render the diode weakly absorbing of emitted and received radiation and the end of the fiber is positioned approximately against the n-region in said well.

2. The invention defined in claim 1 in which the bidirectional transducers are GaAs semiconductor diodes.

3. The invention defined in claim 1 in which the bidirectional transducer elements are gallium aluminum arsenide semiconductor diodes.

4. The invention defined in claim 1 wherein the cable assembly is detachably connected between separated electronic terminals such that the signals can be transmitted in a bidirectional manner over the optical fiber cable assembly in the form of light signals, and in which the detachable connections are performed with electrically transmitting connectors.

5. The invention defined in claim 4 in which the electronic terminals perform a switching function to determine and control which direction along the fiber one of said signals will be transmitted at any given time.

6. The invention defined in claim 4 including a plurality of optical fiber cable assemblies and in which switching and distributing of signals among the optical fibers of the cable assemblies is performed by multiterminal active star couplers receiving and transmitting signals from the bidirectional electronic terminals such that a signal input to any one of the terminals causes an equivalent output signal to be transmitted from each of the other terminals.

7. An invention including at least one optical fiber cable assembly for the transmission of signals in either direction from one end of the cable assembly to the other, said cable assembly being terminated at each of the two ends with an electrical connector, and each of said connectors containing at least one semiconductor diode which functions as a dual function transducer, said diode adapted to convert the signals both from optical to electrical form and from electrical to optical form, and said cable assembly having one or more optical fibers to transmit the signals in optical form between the transducer diodes, and the end of the fiber is focused onto the diode by a lens whose axis is essentially perpendicularly to the diode junction plane, the cable assembly further characterized in that the semiconductor diodes are provided with a well in the n-region to render the diodes weakly absorbing of emitted and received radiation and the lens axis is positioned to be focused approximately against the n-region in said well.

8. The invention defined in claim 7 in which the bidirectional transducers are GaAs semiconductor diodes.

9. The invention defined in claim 7 in which the bidirectional transducer elements are gallium aluminum arsenide semiconductor diodes.

10. The invention defined in claim 8 wherein the cable assembly is detachably connected between separated electronic terminals such that the signals can be transmitted in a bidirectional manner over the optical fiber cable assembly in the form of light signals, and in which the detachable connections are performed with electrically transmitting connectors.

11. The invention defined in claim 10 in which the electronic terminals perform a switching function to determine and control which direction along the fiber one of said signals will be transmitted at any given time.

12. The invention defined in claim 10 including a plurality of optical fiber cable assemblies and switching and distribution of signals among the optical fibers of the cable assemblies is performed by multiterminal active star couplers receiving and transmitting signals from the bidirectional electronic terminals such that a signal input to any one of the terminals causes an equivalent output signal to be transmitted from each of the other terminals.

* * * * *